United States Patent
Fong

(10) Patent No.: US 8,377,623 B2
(45) Date of Patent: Feb. 19, 2013

(54) PHOTOCURABLE RESIN COMPOSITION FOR PRODUCING THREE DIMENSIONAL ARTICLES HAVING HIGH CLARITY

(75) Inventor: John Wai Fong, Temple City, CA (US)

(73) Assignee: 3D Systems, Inc., Rock Hill, SC (US)

( * ) Notice: Subject to any disclaimer, the term of this patent is extended or adjusted under 35 U.S.C. 154(b) by 225 days.

(21) Appl. No.: 12/745,036

(22) PCT Filed: Nov. 21, 2008

(86) PCT No.: PCT/US2008/084332
§ 371 (c)(1),
(2), (4) Date: May 27, 2010

(87) PCT Pub. No.: WO2009/070500
PCT Pub. Date: Jun. 4, 2009

(65) Prior Publication Data
US 2010/0304100 A1    Dec. 2, 2010

Related U.S. Application Data

(60) Provisional application No. 60/990,403, filed on Nov. 27, 2007.

(51) Int. Cl.
*G03C 1/00* (2006.01)
*G03C 5/00* (2006.01)
*G03F 7/00* (2006.01)
*C08G 59/68* (2006.01)

(52) U.S. Cl. ......... 430/269; 430/280.1; 522/15; 522/25; 522/31

(58) Field of Classification Search .................. 430/269, 430/280.1; 522/15, 25, 31
See application file for complete search history.

(56) References Cited

U.S. PATENT DOCUMENTS

| | | | |
|---|---|---|---|
| 3,708,296 A | | 1/1973 | Schlesinger |
| 4,090,936 A | * | 5/1978 | Barton ....................... 430/280.1 |
| 4,186,108 A | | 1/1980 | Carlson et al. |
| 4,853,434 A | | 8/1989 | Block |
| 5,639,413 A | | 6/1997 | Crivello |
| 5,972,563 A | | 10/1999 | Steinmann et al. |
| 6,100,007 A | * | 8/2000 | Pang et al. ..................... 430/269 |
| 6,130,025 A | * | 10/2000 | Chikaoka et al. ........... 430/280.1 |
| 6,413,696 B1 | * | 7/2002 | Pang et al. .................. 430/280.1 |
| 6,413,697 B1 | | 7/2002 | Melisaris et al. |
| 6,811,937 B2 | | 11/2004 | Lawton |
| 6,863,701 B2 | | 3/2005 | Crivello |
| 6,906,113 B2 | | 6/2005 | Baudin et al. |
| 7,183,040 B2 | | 2/2007 | Thies et al. |
| 7,232,850 B2 | * | 6/2007 | Johnson et al. ............... 522/100 |
| 7,820,275 B2 | * | 10/2010 | Johnson et al. ............... 428/212 |
| 7,964,248 B2 | * | 6/2011 | Fong et al. .................... 427/466 |
| 2003/0198824 A1 | * | 10/2003 | Fong et al. .................... 428/515 |
| 2004/0142274 A1 | | 7/2004 | Thies |
| 2006/0172230 A1 | * | 8/2006 | Lawton et al. ................ 430/322 |
| 2007/0256781 A1 | | 11/2007 | Johnson et al. |
| 2008/0182078 A1 | | 7/2008 | Johnson et al. |
| 2010/0119835 A1 | * | 5/2010 | Messe et al. .................. 428/414 |

FOREIGN PATENT DOCUMENTS

WO    WO 2005/045523    5/2005
WO    2008127930    10/2008

OTHER PUBLICATIONS

Extended European Search Report dated Apr. 11, 2012 for European counterpart Application No. 08853243.7.

* cited by examiner

*Primary Examiner* — Nathan M Nutter

(57) ABSTRACT

The present invention provides a low viscosity photocurable composition including (i) a cationically curable component comprising a polyglycidyl epoxy compound (ii) a free radically active component (iii) a cationic photoinitiator (v) a free radical photoinitiator and optionally (iv) one or more optional components. The photocurable composition can be cured using rapid prototyping techniques to form clear, colorless three-dimensional articles having excellent mechanical properties.

21 Claims, 2 Drawing Sheets

PHOTOCURABLE RESIN COMPOSITION FOR PRODUCING THREE DIMENSIONAL ARTICLES HAVING HIGH CLARITY

CROSS-REFERENCE TO RELATED APPLICATION

This application claims priority to U.S. patent application Ser. No. 60/990,403, filed Nov. 27, 2007, the entire contents of which is incorporated herein by reference.

STATEMENT REGARDING FEDERALLY SPONSORED RESEARCH OR DEVELOPMENT

Not Applicable.

FIELD OF THE INVENTION

The present invention is directed to a low viscosity photocurable composition which is particularly suitable for the production of a three-dimensional article by stereolithography having high clarity and that is also colorless as well as to a process for the production of clear, colorless cured articles and the clear, colorless cured three-dimensional shaped articles themselves. In particular, this invention relates to a low viscosity photocurable composition from which clear, colorless cured three-dimensional shaped articles having excellent mechanical properties and water resistance are produced.

BACKGROUND OF THE INVENTION

Liquid-based Solid Imaging, for example, stereolithography, is a process whereby a photoformable liquid is applied as a thin layer to a surface and exposed to actinic radiation such that the liquid solidifies. Subsequently, new thin layers of photoformable liquids are coated onto previous layers of liquid or previously solidified sections. The new layers are then exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition.

Three-dimensional articles produced from conventional hybrid compositions (a composition with both cationically curable and free radical curable compounds) by stereolithography tend to have low clarity. In particular, such articles may be hazy and/or highly colored. This haziness is likely due in part to poor miscibility of the cationically curable and free radically curable compounds, which is accentuated by their different rates of reaction.

U.S. Pat. No. 6,811,937 discloses a radiation curable hybrid composition which produces three-dimensional articles having improved clarity. The hybrid composition contains a cycloaliphatic epoxy and low molecular weight polyTHF combined with specific acrylates, in particular, erythritol hexacrylate. WO05045523 also discloses a photocurable hybrid composition for producing high clarity three-dimensional articles in which the epoxy component contains little or no glycidyl epoxy compound.

An object of the present invention is to provide an improved photocurable hybrid composition having higher carbon and hydrogen content and low or no antimony content that, upon cure, produces a three-dimensional article that is clear, colorless, and also maintains excellent mechanical properties, including high strength and water resistance, for longer periods of time which can be used in various applications.

SUMMARY OF THE INVENTION

The present invention provides a low viscosity photocurable composition containing about 35-80% by weight of a cationically curable component, about 5-60% by weight of a free radically active component, about 0.1-10% by weight of a cationic photoinitiator, 0.01-10% by weight of a free radical photoinitiator and one or more optional components, where the percent by weight is based on the total weight of the photocurable composition.

In one embodiment, the present invention provides a photocurable composition containing:
(a) a cationically curable component comprising at least one polyglycidyl epoxy compound and optionally at least one oxetane;
(b) a free radically active component comprising an ethoxylated or propoxylated poly(meth)acrylate or mixture thereof and optionally a non-aromatic poly(meth)acrylate;
(c) an antimony-free cationic photoinitiator;
(d) a free radical photoinitiator; and
(e) one or more optional components
wherein the photocurable composition, after cure, produces a clear, colorless article having high strength. In one embodiment, component a) is a polyglycidyl compound containing hydrogenated aromatic and/or polycyclic aliphatic groups which may or may not be fused.

The photocurable composition of the present invention can be rapidly cured by forming a layer of the composition on a substrate or surface and exposing the layer imagewise to actinic radiation of sufficient intensity to cause substantial curing of the layer in the exposed areas so that an imaged cross-section is formed. A second layer of the photocurable composition may then be formed on the prior imaged cross-section and exposed to actinic radiation of sufficient intensity to cause substantial curing of the second layer and to cause adhesion to the prior imaged cross-section. This may be repeated a sufficient number of times for the purpose of building up a dimensionally accurate three-dimensional article which can be used in various applications.

BRIEF DESCRIPTION OF FIGURES

For a detailed understanding and better appreciation of the present invention, reference should be made to the following detailed description of the invention, taken in conjunction with the accompanying figures.

DETAILED DESCRIPTION OF THE INVENTION

Figure 1:
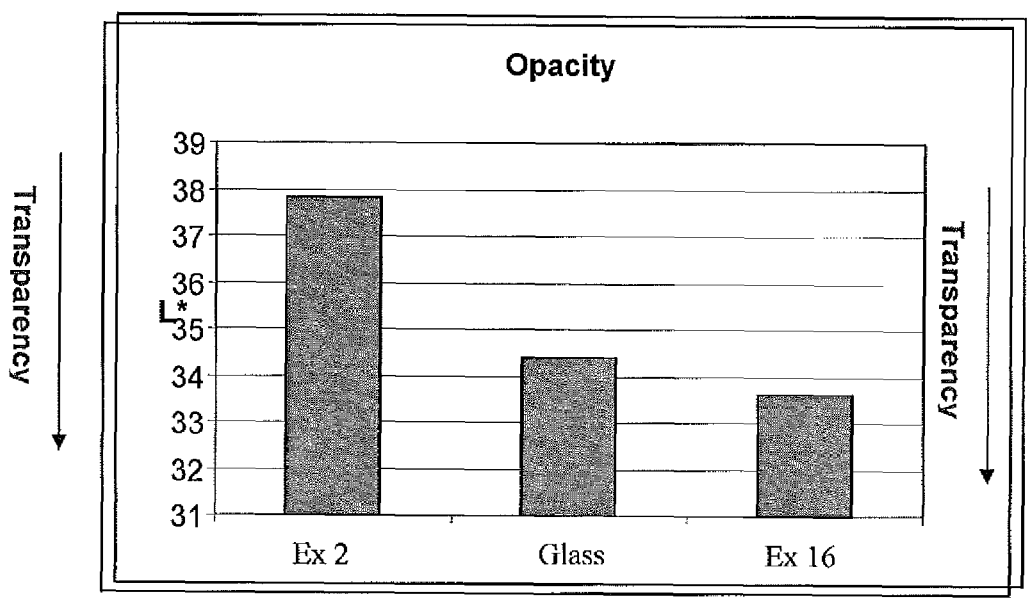
FIGS. 1 and 2 are graphs describing color measurements taken for glass and cured articles produced from a comparative photocurable composition and a photocurable composition according to the present invention.

The photocurable composition of the present invention is a low viscosity photocurable composition which produces three-dimensional articles, films or coatings that are clear, colorless, and have improved mechanical properties, and which furthermore exhibit superior stability over time. By "clear" it is meant that the article, film or coating is transparent and thus, the article, film or coating has the capability of transmitting rays of light through its substance so that bodies situated beyond or behind can be distinctly seen. Cured articles, films or coatings that appear hazy or cloudy are not clear. By "colorless" it is meant that the article, film or coating produced from the photocurable composition of the present invention lacks color and has a yellowness index (as measured according to ASTM D1925)/inch thickness of the respective article, film or coating of less than 70. Articles, films or coatings having a yellowness index/inch thickness greater than 70 are not colorless.

Cationically Curable Component

As a first essential component, the photocurable composition of the present invention includes from about 35-80% by weight, preferably from about 40-70% by weight, based on the total weight of the photocurable composition, of a cationically curable component. The cationically curable component includes at least one cationically curable compound characterized by having functional groups capable of reacting via or as a result of a ring-opening mechanism initiated by cations to form a polymeric network. Examples of such functional groups include oxirane-(epoxide), oxetane-, tetrahydrofuran- and lactone-rings in the compound. Such compounds may have an aliphatic, aromatic, cycloaliphatic (including fused ring systems), araliphatic, hydrogenated aromatic or heterocyclic structure and they may contain the ring groups as side groups, or the functional group can form part of an alicyclic or heterocyclic ring system. The cationically curable compound may be difunctional, trifunctional or may contain more than three cationically curable groups.

The cationically curable component may include a single liquid cationically curable compound, a combination of liquid cationically curable compounds, or a combination of one or more liquid cationically curable compounds and one or more solid cationically curable compounds which are soluble in the liquid.

In one embodiment, the cationically curable compound includes one or more epoxy-containing compounds. Examples of such epoxy-containing compounds include polyglycidyl epoxy compounds, non-glycidyl epoxy compounds, epoxy cresol novolac and epoxy phenol novolac compounds.

The polyglycidyl epoxy compound may be a polyglycidyl ether, poly(β-methylglycidyl)ether, polyglycidyl ester or poly(β-methylglycidyl) ester. The synthesis and examples of polyglycidyl ethers, poly(β-methylglycidyl)ethers, polyglycidyl esters and poly(β-methylglycidyl) esters are disclosed in U.S. Pat. No. 5,972,563, which is incorporated herein by reference. For example, ethers may be obtained by reacting a compound having at least one free alcoholic hydroxyl group and/or phenolic hydroxyl group with a suitably substituted epichlorohydrin under alkaline conditions or in the presence of an acidic catalyst followed by alkali treatment. The alcohols may be, for example, acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bis-trimethylolpropane, pentaerythritol and sorbitol. Suitable glycidyl ethers may also be obtained, however, from cycloaliphatic alcohols, such as 1,3- or 1,4-dihydroxycyclohexane, bis(4-hydroxycyclohexyemethane, 2,2-bis(4-hydroxycyclohexyl)propane or 1,1-bis(hydroxymethyl)cyclohex-3-ene, or they may possess aromatic rings, such as N,N-bis(2-hydroxyethyl)aniline or p,p'-bis(2-hydroxyethylamino)diphenylmethane.

Particularly important representatives of polyglycidyl ethers or poly(β-methylglycidyl)ethers are based on monocyclic phenols, for example, on resorcinol or hydroquinone, on polycyclic phenols, for example, on bis(4-hydroxyphenyl)methane (Bisphenol F), 2,2-bis(4-hydroxyphenyl)propane (Bisphenol A), bis(4-hydroxyphenyl)S (Bisphenol S), alkoxylated Bisphenol A, F or S, triol extended Bisphenol A, F or S, brominated Bisphenol A, F or S, hydrogenated Bisphenol A, F or S, glycidyl ethers of phenols and phenols with pendant groups or chains, on condensation products, obtained under acidic conditions, of phenols or cresols with formaldehyde, such as phenol novolaks and cresol novolaks, or on siloxane diglycidyls. Hydrogenated versions of such compounds are highly preferred.

Polyglycidyl esters and poly(β-methylglycidyl) esters may be produced by reacting epichlorohydrin or glycerol dichlorohydrin or β-methylepichlorohydrin with a polycarboxylic acid compound. The reaction is expediently carried out in the presence of bases. The polycarboxylic acid compounds may be, for example, glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, may be used.

In another embodiment, the epoxy-containing compound is a non-glycidyl epoxy compound. Non-glycidyl epoxy compounds may be linear, branched, or cyclic in structure. For example, there may be included one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. Examples are disclosed in U.S. Pat. No. 5,639,413, which is incorporated herein by reference. Still others include epoxides which contain one or more cyclohexene oxide groups and epoxides which contain one or more cyclopentene oxide groups. Preferably, the cationically curable component contains no or low amounts of a non-glycidyl epoxy compound.

Particularly suitable non-glycidyl epoxy compound's include the following difunctional non-glycidyl epoxide compounds in which the epoxide groups form part of an alicyclic or heterocyclic ring system: bis(2,3-epoxycyclopentyl)ether, 1,2-bis(2,3-epoxycyclopentyloxy)ethane, 3,4-epoxycyclohexyl-methyl 3,4-epoxycyclohexanecarboxylate, 3,4-epoxy-6-methyl-cyclohexylmethyl 3,4-epoxy-6-methyl-cyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexanecarboxylate), ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane, and 2,2'-bis-(3,4-epoxy-cyclohexyl)-propane. Particularly preferred are those versions which do not have an ester group.

In another embodiment, the cationically curable compound is a poly(N-glycidyl) compound or poly(S-glycidyl) compound. Poly(N-glycidyl) compounds are obtainable, for example, by dehydrochlorination of the reaction products of epichlorohydrin with amines containing at least two amine hydrogen atoms. These amines may be, for example, n-butylamine, aniline, toluidine, m-xylylenediamine, bis(4-aminophenyl)methane or bis(4-methylaminophenyl)methane.

Other examples of poly(N-glycidyl) compounds include N,N'-diglycidyl derivatives of cycloalkyleneureas, such as ethyleneurea or 1,3-propyleneurea, and N,N-diglycidyl derivatives of hydantoins, such as of 5,5-dimethylhydantoin. Examples of poly(S-glycidyl) compounds are di-S-glycidyl derivatives derived from dithiols, for example ethane-1,2-dithiol or bis(4-mercaptomethylphenyl)ether.

It is also possible to employ epoxy-containing compounds in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N-(2-glycidyloxypropyl)-5,5-dimethylhydantoin or 2-glycidyloxy-1,3-bis(5,5-dimethyl-1-glycidylhydantoin-3-yl)propane.

Other epoxide derivatives may be employed, such as vinyl cyclohexene dioxide, limonene dioxide, limonene monoxide, vinyl cyclohexene monoxide, 3,4-epoxycyclohexlmethyl acrylate, 3,4-epoxy-6-methyl cyclohexylmethyl 9,10-epoxystearate, and 1,2-bis(2,3-epoxy-2-methylpropoxy) ethane.

Also conceivable is the use of liquid pre-reacted adducts of epoxy-containing compounds, such as those mentioned above, with hardeners for epoxy resins. It is of course also possible to use liquid mixtures of liquid or solid epoxy resins in the novel compositions.

The following are examples of commercial epoxy-containing compounds suitable for use in the present invention: Uvacure® 1500 (3,4-epoxycyclohexylmethyl-3',-4'-epoxycyclohexanecarboxylate, available from UCB Chemicals Corp.); Epalloy® 5000 (epoxidized hydrogenated Bisphenol A, available from CVC Specialties Chemicals, Inc.) Heloxy™ 48 (trimethylol propane triglycidyl ether, available from Resolution Performance Products LLC); Heloxy™ 107 (diglycidyl ether of cyclohexanedimethanol, available from Resolution Performance Products LLC); Uvacure® 1501 and 1502 which are proprietary cycloaliphatic epoxies, Uvacure® 1530-1534 which are cycloaliphatic epoxies blended with a proprietary polyol, Uvacure® 1561 and Uvacure® 1562 which are proprietary cycloaliphatic epoxies having a (meth)acrylic unsaturation (all available from UCB Chemicals Corp.); Cyracure® UVR-6100, -6105, -6107, and -6110 which are all 3,4-epoxycyclohexylmethyl-3',4'-epoxycyclohexanecarboxylate, Cyracure® UVR-6128, a bis(3,4-epoxycyclohexyl) adipate (all available from Dow Chemical Co.); DER 332, a bisphenol A diglycidyl ether (available from Dow Chemical Co.); Araldite® CY 179, a 3,4-epoxycyclohexylmethyl-3',4'-epoxycyclohexanecarboxylate and Araldite® PY 284, a diglycidyl hexahydrophthalate polymer (available from Huntsman Advanced Materials Americas Inc.); Celoxide™ 2021, a 3,4-epoxycyclohexyl methyl-3',4'-epoxycyclohexyl carboxylate, Celoxide™ 2021 P, a 3',4'-epoxycyclohexanemethyl 3'-4'-epoxycyclohexyl-carboxylate, Celoxide™ 2081, a 3'-4'-epoxycyclohexanemethyl 3'-4'-epoxycyclohexyl-carboxylate modified caprolactone, Celoxide™ 2083, Celoxide™ 2085, Celoxide™ 2000, Celoxide™ 3000, Epolead GT-300, Epolead GT-302, Epolead GT-400, Epolead 401, Epolead 403 (all available from Daicel Chemical Industries Co., Ltd.) DCA, an alicyclic epoxy (available from Asahi Denka Co. Ltd); and E1, an epoxy hyperbranched polymer obtained by the polycondensation of 2,2-dimethylolpropionic acid functionalized with glycidyl groups (available from Perstorp AB).

In another embodiment, the cationically curable compound is an oxetane compound. The following compounds are given as examples of oxetane compounds having one oxetane ring in the compound which may be used in the present invention: 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyldiethylene glycol(3-ethyl-3-oxetanylmethyl)ether, dicyclopentadiene (3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3-ethyl-3-oxetanylmethyl) ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether, and the like. Other examples of oxetane compounds suitable for use include trimethylene oxide, 3,3-dimethyloxetane, 3,3-dichloromethyloxetane, 3,3-[1,4-phenylene-bis(methyleneoxymethylene)]-bis(3-ethyloxetane), 3-ethyl-3-hydroxymethyl-oxetane, and his-[(1-ethyl(3-oxetanyemethyl)]ether.

Examples of compounds having two or more oxetane rings in the compound which may be used in the present invention include: 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis (3-ethyl-3 oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl) ether, trimethylolpropane tris(3-ethyl-3-oxetanylmethyl) ether, 1,4-bis(3-ethyl-3 oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified Bisphenol A bis(3-ethyl-3-oxetanylmethyl)ether, PO-modified Bisphenol A bis (3-ethyl-3-oxetanylmethyl)ether, EO-modified hydrogenated Bisphenol A bis(3-ethyl-3-oxetanylmethyl) ether, PO-modified hydrogenated Bisphenol A bis(3-ethyl-3-oxetanylmethyl)ether, EO-modified Bisphenol F (3-ethyl-3-oxetanylmethyl)ether, and the like.

Of the above compounds, it's preferable that the oxetane compounds have 1-10, preferably 1-4, and even more preferably 1 oxetane rings in the compound. Specifically, 3-ethyl-3-hydroxymethyl oxetane, (3-ethyl-3-oxetanylmethoxy)methylbenzene, 1,4-bis[(3-ethyl-3-oxetanylmethoxy)methyl] benzene, 1,2-bis(3-ethyl-3-oxetanylmethoxy)ethane and trimethylolpropane tris(3-ethyl-3-oxetanylmethyl)ether are preferably used. Commercially available oxetane compounds include Cyracure® UVR 6000 (available from Dow Chemical Co.) and Aron Oxetane OXT-101, OXT-121, OXT-211, OXT-212, OXT-221, OXT-610 and OX-SQ (available from Toagosei Co. Ltd.).

The cationically curable compound may also be a cyclic ether compound, cyclic lactone compound, cyclic acetal compound, cyclic thioether compound, Spiro orthoester compound or vinylether compound.

Furthermore, as noted above, it is possible that the cationically curable component of the present invention includes one or a mixture of two or more of the cationically curable compounds described above.

In one embodiment, the cationically curable component includes one or more polyglycidyl epoxy compounds. Preferably the polyglycidyl epoxy compound is a hydrogenated aromatic polyglycidyl compound which is derived from a hydrogenated aromatic compound, for example, a hydrogenated phenolic compound such as hydrogenated phenol, methylphenol or diphenol alkane. Thus, the polyglycidyl epoxy compound may be derived from hydrogenated bis(4-hydroxyphenyl)alkane or 2,2'-bis(4-hydroxyphenyl)propane. In another embodiment, the polyglycidyl epoxy compound is a hydrogenated bisphenol epoxy-containing compound having an average epoxy functionality of at least 2 and an epoxy equivalent weight (EEW) between 100 and 500. The polyglycidyl epoxy compounds) may be present in the photocurable composition in an amount of at least about 35% by weight, more preferably at least about 40% by weight, and even more preferably at least about 45% by weight based on the total weight of the photocurable composition. In yet another embodiment, the polyglycidyl epoxy compound may be present in the photocurable composition in an amount of at most about 80% by weight, preferably at most about 70% by weight, and even more preferably at most about 55% by weight based on the total weight of the photocurable composition. In yet a further embodiment, the polyglycidyl epoxy compound may be present in the range of from about 35-80% by weight, preferably from about 40-60% by weight and even more preferably from about 45-55% by weight based on the total weight of the photocurable composition.

In another embodiment, the cationically curable component further includes one or more oxetane compounds so that the amount of oxetane present in the photocurable composition is at least about 5% by weight, more preferably at least about 10% by weight and even more preferably at least about 15% by weight based on the total weight of the photocurable composition. In yet another embodiment, the oxtetane compound may be present in the photocurable composition at an amount of at most about 40% by weight, more preferably at most about 30% by weight, and even more preferably at most about 25% by weight based on the total weight of the photocurable composition. In yet a further embodiment, the oxetane compound may be present in the photocurable composition in the range from about 0.01-40% by weight, more preferably 0.1-25% by weight, and even more preferably from about 0.5-15% by weight based on the total weight of the photocurable composition. In still another embodiment, the oxetane compound may be present in the range from about 5-30% by weight, based on the total weight of the photocurable composition.

In another embodiment, the cationically curable component contains less than about 1% by weight, preferably less than about 0.5% by weight, and even more preferably less than about 0.1% by weight of a non-glycidyl epoxy compound. In yet another embodiment, the cationically curable component does not contain a non-glycidyl epoxy compound.

Free Radically Active Component

As a second essential component, the photocurable composition of the present invention includes a free radically active component in an amount of at least about 5% by weight to about 60% by weight, preferably greater than 20% by weight and less than about 40% by weight, and more preferably greater than 25% by weight and less than about 40% by weight, based on the total weight of the photocurable composition. The free radically active component includes at least one free radically active compound that is activated in the presence of an initiator capable of initiating free radical polymerization such that it is available for reaction with other compounds bearing free radically active functional groups.

Examples of free radically active compounds include compounds having one or more ethylenically unsaturated groups, such as, compounds having (meth)acrylate groups. "(Meth)acrylate" refers to an acrylate, a methacrylate, or a mixture thereof and includes monofunctional monomers containing one ethylenically unsaturated bond in one compound and polyfunctional monomers containing two or more unsaturated bonds in one compound.

In one embodiment, the (meth)acrylate is a monofunctional monomer. Examples of monofunctional monomers include: (meth)acrylamide, (meth)acryloylmorpholine, 7-amino-3,7-dimethyloctyl(meth)acrylate, isobutoxymethyl (meth)acrylamide, isobornyloxyethyl(meth)acrylate, isobornyl(meth)acrylate, 2-ethylhexyl(meth)acrylate, ethyldiethylene glycol(meth)acrylate, t-octyl(meth)acrylamide, diacetone (meth)acrylamide, dimethylaminoethyl(meth)acrylate, diethylaminoethyl(meth)acrylate, lauryl(meth)acrylate, dicyclopentadiene(meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl (meth)acrylate, 2-hydroxypropyl(meth)acrylate, vinylcaprolactam, N-vinylpyrrolidone, phenoxyethyl(meth)acrylate, butoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate and methyltriethylene diglycol (meth)acrylate and mixtures thereof.

Examples of commercially available monofunctional monomers include SR 313A, 31313 and 313D ($C_{12}$-$C_{14}$ alkyl (meth)acrylates available from Sartomer Co. Inc.) and Ciba® Ageflex FM6 (n-hexyl(meth)acrylate available from Ciba Specialty Chemicals).

In another embodiment, the (meth)acrylate is a polyfunctional or poly(meth)acrylate having a functionality of 2 or more. Examples of poly(meth)acrylates include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl)isocyanurate di(meth)acrylate, tris(2-hydroxyethyl)isocyanurate tri(meth)acrylate, caprolactone-modified tris(2-hydroxyethyl)isocyanurate tri(meth)acrylate, trimethylolpropane tri(meth)acrylate, EO-modified trimethylolpropane tri(meth)acrylate, PO-modified trimethylolpropane tri(meth)acrylate, tripropylene glycol di(meth)acrylate, neopentyl glycol di(meth)acrylate, propoxylated neopentyl glycol di(meth)acrylate, 1,4-butanediol di(meth)acrylate, 1,6-hexanediol di(meth)acrylate, polyester di(meth)acrylate, polyethylene glycol di(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate and mixtures thereof. The poly(meth)acrylate however is not a pentaerythritol (meth)acrylate or dipentaerythritol (meth)acrylate. "Pentaerythritol (meth)acrylate" and "dipentaerythritol (meth)acrylate" is an acrylate, (meth)acrylate, or a mixture thereof, of an alcohol that has been prepared by reacting methacrylic acid with the alcohol pentaerythritol or dipentaerythritol.

Highly preferred polyfunctional (meth)acrylates are EO-modified trimethylolpropane tri(meth)acrylate, PO-modified trimethylolpropane tri(meth)acrylate, tripropylene glycol di(meth)acrylate, neopentyl glycol di(meth)acrylate, propoxylated neopentyl glycol di(meth)acrylate, 1,4-butanediol di(meth)acrylate, 1,6-hexanediol di(meth)acrylate, polyester di(meth)acrylate, polyethylene glycol di(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, EO-modified hydrogenated bisphenol F di(meth)acrylate and mixtures thereof. The following are examples of commercially available poly(meth)acrylates: SR 238 (1,6-hexanediol diacrylate); SR 350 (trimethylolpropane trimethacrylate); SR 351 (trimethylolpropane triacrylate); SR 367 (tetramethylolmethane tetramethacrylate); SR 368 (tris(2-acryloxy ethyl) isocyanurate triacrylate); SR 454 (ethoxylated (3) trimethylolpropane triacrylate); SR 499 (ethoxylated trimethylolpropane triacrylate); SR 8335 (tricyclodecane dimethanol diacrylate); SR 9003 (propoxylated (2) neopentyl glycol diacrylate) available from Sartomer Co Inc.

Additional examples of commercially available acrylates include Kayarad® R-526 (hexanedioic acid, bis[2,2-dimethyl-3-[(1-oxo-2-propenyl)oxy]propyl]ester), SR 247 (neopentyl glycol diacrylate), SR 06 (tripropylene glycol diacrylate), Kayarad® R-551 (Bisphenol A polyethylene glycol diether diacrylate), Kayarad® R-712 (2,2'-Methylenebis[p-phenylenepoly(oxy-ethylene)oxy]diethyl diacrylate), Kayarad® R-604 (2-Propenoic acid, [2-[1,1-dimethyl-2-[(1-oxo-2-propenyl)oxy]ethyl]-5-ethyl-1,3-dioxan-5-yl]-methyl ester), Kayarad® R-684 (dimethyloltricyclodecane diacrylate), GPO-303 (polyethylene glycol dimethacrylate), Kayarad® THE-330 (ethoxylated trimethylolpropane triacrylate), DPHA-2H, DPHA-2C, Kayarad® D-310 (DPHA), Kayarad® D-330 (DPHA), DPCA-20, DPCA-30, DPCA-60, DPCA-120, DN-0075, DN-2475, Kayarad® T-1420 (ditrimethylolpropane tetraacrylate), Kayarad® T-2020 (ditrimethylolpropane tetraacrylate), TPA-2040, TPA-320, TPA-330; R-011, R-300, R-205 (methacrylic acid, zinc salt, same as SR 634) (available from Nippon Kayaku Co., Ltd.); Aronix M-210, M-220, M-233, M-240, M-215, M-305, M-309, M-310, M-315, M-325, M-400, M-6200, M-6400 (available from Toagosei Chemical Industry Co, Ltd.); Light acrylate BP-4EA, BP-4PA, BP-2EA, BP-2PA, DCP-A (available from Kyoeisha Chemical Industry Co., Ltd.); New Frontier BPE-4, TEICA, BR-42M, GX-8345 (available from Daichi Kogyo Seiyaku Co., Ltd.); ASF-400 (available from Nippon Steel Chemical Co.); Ripoxy SP-1506, SP-1507, SP-1509, VR-77, SP-4010, SP-4060 (available from Showa Highpolymer Co., Ltd.); NK Ester A-BPE-4 (available from Shin-Nakamura Chemical Industry Co., Ltd.); SA-1002 (available from Mitsubishi Chemical Co., Ltd.); Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (available from Osaka Organic Chemical Industry Co., Ltd.).

The free radically active compound may also be an epoxy functionalized compound. Such epoxy functionalized compounds may be obtained by means well known, for example, by reacting a di- or poly-epoxide with one or more equivalents of an ethylenically unsaturated carboxylic acid. An example of such a compound is the reaction product of UVR-6105 with one equivalent of methacrylic acid. Commercially available compounds having epoxy and free-radically active functionalities include the "Cyclomer" series, such as Cyclomer M-100, M-101, A-200 and A-400 available from Daicel Chemical Industries Ltd., Japan, and Ebecryl-3605 and -3700 available from UCB Chemical Corp.

It is possible that the free radically active component of the present invention includes a mixture of the free radically active compounds described above. The free radical active component however is preferably not an aromatic free radically active component. Thus, in another embodiment, the free radically active component is not an aromatic free radically active component, but is instead a hydrogenated aromatic free radically active component.

In one embodiment, the free radically active component includes an ethoxylated or propoxylated poly(meth)acrylate or a mixture thereof. The photocurable composition may contain at least 5% by weight, more preferably at least 10% by weight, and even more preferably at least 20% by weight of the ethoxylated or propoxylated poly(meth)acrylate or mixture thereof based on the total weight of the photocurable composition. In another embodiment, the photocurable composition includes at most about 60% by weight, more preferably at most about 45% by weight, and even more preferably at most about 40% by weight of the ethoxylated or propoxylated poly(meth)acrylate based on the total weight of the photocurable composition. In yet another embodiment, the ethoxylated or propoxylated poly(meth)acrylate is present in the photocurable composition in the range of from about 5-60% by weight, more preferably from about 10-40% by weight, and even more preferably from about 15-25% by weight based on the total weight of the photocurable composition.

In another embodiment, the free radically active component includes the ethoxylated or propoxylated poly(meth)acrylate or mixture thereof in combination with one or more non-aromatic poly(meth)acrylates, preferably an alicyclic acrylate. The amounts of the ethoxylated or propoxylated poly(meth)acrylate or mixture thereof plus the non-aromatic poly(meth)acrylate are chosen such that at least 40% by weight, more preferably at least 50% by weight, and even more preferably at least about 60% by weight of the free radically active component is ethoxylated or propoxylated poly(meth)acrylate or mixture thereof.

Cationic Photoinitiator

As a third essential component, the photocurable composition of the present invention includes from about 0.1-10% by weight, based on the total weight of the photocurable composition, of a cationic photoinitiator.

The cationic photoinitiator may be any suitable type of photoinitiator that, upon exposure to actinic radiation, forms cations that initiate the reactions of the cationic curable component, such as the epoxy-containing compound(s). Examples of cationic photoinitiators include onium salts with anions of weak nucleophilicity. Other examples include halonium salts, iodosyl salts or sulfonium salts, sulfoxonium salts, or diazonium salts or metallocene salts.

In one embodiment, the cationic photoinitiator is an antimony-free cationic photoinitiator. It has been surprisingly found that the use of an antimony-free cationic photoinitiator in the photocurable composition of the present invention produces a non-toxic photocurable composition having a cure speed similar to photocurable compositions containing an antimony cationic photoinitiator and that upon curing, produces a non-toxic article having much improved mechanical properties. It has also been surprisingly found that known slower reacting polyglycidyl epoxy compounds such as those derived from hydrogenated phenolic compounds and poly (meth)acrylates described above, when combined with the antimony-free cationic photoinitiator, yield photocurable compositions having good cure sensitivity, high accuracy and a good balance of mechanical properties in the clear and colorless final cured object.

The antimony-free cationic photoinitiator may be chosen from those commonly used to initiate cationic photopolymerization including onium salts with anions of weak nucleophilicity, e.g., halonium salts, iodosyl salts, sulfonium salts, sulfoxonium salts, diazonium salts, pyrylium salts or pyridinium salts. Metallocene salts are also suitable as photoinitiators. Onium salt and metallocene salt photoinitiators are described in U.S. Pat. No. 3,708,296; J. V. Crivello, "Photoinitiated Cationic Polymerization," UV Curing: Science & Technology, (S. P. Pappas, ed., Technology Marketing Corp. 1978) and J. V. Crivello and K. Dietliker, "Photoinitiators for Cationic Polymerisation," Chemistry and Technology of UV & EV Formulation for Coatings, Inks & Paints 327-478 (P. K. Oldring, ed., SITA Technology Ltd 1991), each of which are incorporated herein by reference.

The antimony-free cationic photoinitiator may also be a dialkylphenylacylsulfonium salt as described in U.S. Pat. No. 6,863,701 and which is incorporated herein by reference. These antimony-free cationic photoinitiators have the general formula $A_1(CA_2A_3OH)_n$ where $A_1$ is selected from phenyl, polycyclic aryl, and polycyclic heteroaryl, each optionally substituted with one or more electron donating groups, $A_2$ and $A_3$ are independently selected from hydrogen, alkyl, aryl, alkylaryl, substituted alkyl, substituted aryl and substituted alkylaryl and n is an integer from 1 to 10.

Preferred antimony-free cationic photoinitiators are compounds of the formula (I):

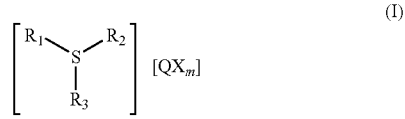

where
$R_1$, $R_2$ and $R_3$ are each independently of one another $C_{6-18}$ aryl that is unsubstituted or substituted by suitable radicals,
Q is boron or phosphorus,
X is a halogen atom, and
m is an integer corresponding to the valence of Q plus 1.

Examples of $C_{6-18}$ aryl are phenyl, naphtyl, anthryl, and phenanthryl. Suitable radicals include alkyl, preferably $C_{1-6}$ alkyl, such as methyl, ethyl, n-propyl, isopropyl, n-butyl, sec-butyl, iso-butyl, tert-butyl, or the various pentyl or hexyl isomers, alkoxy, preferably $C_{1-6}$ alkoxy such as methoxy, ethoxy, propoxy, butoxy, pentyloxy, or hexyloxy, alkylthio, preferably $C_{1-6}$ alkylthio, such as methylthio, ethylthio, propylthio, butylthio, pentylthio, or hexylthio, halogen, such as fluorine, chlorine, bromine, or iodine, amino groups, cyano groups, nitro groups, or arylthio, such as phenylthio. Preferred $QX_m$ groups include $BF_4$ and $PF_6$. A further example of a $QX_m$ group suitable for use is a perfluorophenylborate, for example, tetrakis(perfluorophenyl)borate.

Examples of commercially available antimony-free cationic photoinitiators include: (1) hexafluorophosphate ($PF_6$) salts including (i) Cyracure® UVI-6992 (Dow Chemical Co.), CPI 6992 (Aceto Corp.), Esacure® 1064 (Lamberti s.p.a.) and Omnicat 432 (IGM Resins B.V.) which are triarylsulfonium hexafluorophosphate salts (a mixture of thio and bis salts); (ii) SP-55 (Asahi Denka Co. Ltd.), Degacure KI 85 (Degussa Corp.) and SarCat KI-85 (available from Sartomer Co. Inc.) which are triarylsulfonium hexafluorophosphate salts (bis salts); (iii) SP-150 (Asahi Denka Co. Ltd.) a Bis[4-(di(4-(2-hydroxyethyl)phenyl)sulphonio)-phenyl]sulphide bis-hexafluorophosphate; (iv) Esacure® 1187 (Lamberti s.p.a.) a modified sulfonium hexafluorophosphate salt; (v) metallocene salts including cumenyl cyclopentadienyl iron (II) hexafluorophosphate, Irgacure® 261 (Ciba Specialty Chemicals), Naphthalenylcyclopentadienyl iron (II) hexafluorophosphate, benzyl cyclopentadienyl iron (II) hexafluorophosphate, cyclopentadienyl carbazole iron (II) hexafluorophosphate; (vi) iodonium salts including UV1242 a bis(dodecylphenyl)iodonium hexafluorophosphate (Deuteron), UV2257 a bis(4-methylphenyl)iodonium hexafluorophosphate (Deuteron), and Omnicat 440 (IGM Resins B.V.), Irgacure® 250 (Ciba Specialty Chemicals) a (4-methylphenyl)(4-(2-methylpropyl)phenyl)iodonium hexafluorophosphate; (vii) thioxantene salts including Omnicat 550 (IGM Resins B.V.) a 10-biphenyl-4-yl-2-isopropyl-9-oxo-9H-thioxanthene-10ium hexafluorophosphate, Omnicat 650 (IGM Resins B.V.) an adduct of 10-biphenyl-4-yl-2-isopropyl-9-oxo-9H-thioxanthene-10ium hexafluorophosphate with a polyol; and (2) Pentafluorophenyl borate salts including Rhodorsil 2074 (Rhodia) a (totylcumyl)iodonium tetrakis (pentafluorophenyl)borate. The antimony-free cationic photoinitiator may contain one antimony-free cationic photoinitiator or a mixture of two or more antimony-free cationic photoinitiators.

The proportion of the antimony-free cationic photoinitiator in the photocurable composition may be at least about 0.1% by weight, preferably at least about 1% by weight, and even more preferably at least about 3.5% by weight based on the total weight of the photocurable composition. In another embodiment, the antimony-free cationic photoinitiator is present at most about 10% by weight, more preferably at most about 8% by weight, and even more preferably at most about 7% by weight based on the total weight of the photocurable composition. In yet another embodiment, the antimony-free cationic photoinitiator is present in the range of from about 0.1-10% by weight, preferably from about 0.5-8% by weight, and more preferably from about 2-7% by weight based on the total weight of the photocurable composition.

Free Radical Photoinitiator

The photocurable composition of the present invention also includes from 0.01-10% by weight, preferably from about 1-5% by weight, based on the total weight of the photocurable composition, of a free radical photoinitiator. The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzyl ketals, e.g., benzyl dimethylketal and benzyl diethyl ketal; anthraquinones, e.g., 2-methylanthraquinone, 2-ethylailthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin TPO); bisacylphosphine oxides; benzophenones, e.g., benzophenone and 4,4'-bis(N,N-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure® 184. The free radical photoinitiator may comprise one free radical photoinitiator or two or more free radical photoinitiators.

The proportion of the free radical photoinitiator in the photocurable composition of the present invention may be from about 0.01-10% by weight, more preferably from about 0.2-8% by weight, and even more preferably from about 1-5% by weight based on the total weight of the photocurable composition. In another embodiment, the free radical photoinitiator is present at an amount of about 1:8, preferably about 2:5 parts by weight of free radical photoinitiator to antimony-free cationic photoinitiator.

Optional Components

The photocurable composition of the present invention may also include 0-40% by weight, preferably about 0.0001-40% by weight, based on the total weight of the photocurable composition, of one or more optional components.

The optional component may be a toughening agent, for example, a reactive and/or non-reactive toughener which may be a phase separating rubbery type or core shell type. The toughener however should be compatible with the photocurable compositions described herein and should have very small domains, for example, less than 700 nm, preferably less than 400 nm, and more preferably less than 50 nm, so that the final cured object produced from the photocurable composition is clear.

Thus, in one embodiment, the toughening agent which may be added to the photocurable composition includes reactive particles having a crosslinked elastomeric core and a shell containing reactive groups. The reactive particles may be made by the method disclosed in U.S. Pat. No. 4,853,434, which is incorporated herein by reference. This reference discloses reactive particles that are useful in producing fiber-reinforced plastics, structural adhesives, laminated plastics, and annealing lacquers.

The core of the reactive particles may be composed of polysiloxane, polybutadiene, polybutadiene-co-styrene, amine-terminated polybutadiene, methacrylated polybutadiene, alkyl acrylates, polyorganosiloxane, rubber, poly(ethylene glycol) modified urethane acrylate, polyurethane acrylate polycarbonate, PTFE or other elastomeric material. In one embodiment, the crosslinked core is composed of polysiloxane. In another embodiment, the polysiloxane core is a crosslinked polyorganosiloxane rubber that may include dialkylsiloxane repeating units, where alkyl is a $C_{1-6}$ alkyl. In yet another embodiment, the polysiloxane core includes dimethylsiloxane repeating units.

The shell containing the reactive groups may be composed of poly(styrene-co-acrylonitrile), poly(acrylonitrile), poly (carboxy-functionalized PMMA-co-styrene), polystyrene-co-butyl acrylate, polystyrene, poly(methylmethacrylate-co-maleic anhydride), poly(alkyl methacrylate), poly(styrene-co-acrylonitrile), polystyrene, poly(methylmethacrylate-co-styrene), poly(styrene-co-acrylonitrile), modified vinyl esters, epoxies, PMMA, polyglycidylmethacrylate-co-acrylonitrile, poly(cyclohexanedimethanol terephthalate), thermoplastic resin such as polycarbonate, poly(methylmethacrylate-co-glydicyl methacrylate), poly (methylmethacrylate-co-acrylonitrile-co-divinyl benzene).

The reactive groups of the shell may be epoxy groups, oxetane groups, ethylenically unsaturated groups, and/or hydroxy groups. In one embodiment, the reactive groups may be an oxirane, glycidyl, vinyl ester, vinyl ether, acrylate group, and mixtures thereof.

The reactive particles preferably have an average particle diameter of about 0.01-50 μm, more preferably about 0.1-5 μm, and even more preferably about 0.1 to about 3 μm. For transparency, the particles are ideally less than 200 nm, and preferably less than 50 nm. Examples of reactive particles that are commercially available include Albidur EP 2240, silicone-epoxy particles in Bisphenol A epoxy resin; Albidur VE 3320, silicone-vinyl ester particles in Bisphenol vinyl ester; and Albidur EP 5340, silicone-epoxy particles in cycloaliphatic epoxy resin (all available from Hanse Chemie).

In one embodiment, the reactive particles are added to the photocurable composition as a mixture of the reactive particles and a reactive liquid medium containing, e.g., epoxy or ethylenically unsaturated groups, preferably a hydrogenated liquid medium. Thus, the reactive organosiloxane particles may be dispersed in bisphenol A glycidyl ether for Albidur EP 2240, in bisphenol A vinyl ester for Albidur VE 3320 and in cycloaliphatic epoxide for Albidur EP 5340.

The amount of the reactive particles added to the photocurable composition may be varied depending on the cationically curable component and free radically active component. When present, the photocurable composition may contain at least about 0.5% by weight, more preferably at least about 1% by weight, and even more preferably at least about 1.5% by weight based on the total weight of the photocurable composition of the reactive particles. In another embodiment, the reactive particles present is at most about 40% by weight, more preferably at most about 15% by weight, and even more preferably at most about 10% by weight based on the total weight of the photocurable composition. In yet another embodiment, the reactive particles are present in a range of from about 0.01-40% by weight, preferably from about 0.5-15% by weight, and even more preferably from about 1-5% by weight of the reactive particles based on the total weight of the photocurable composition.

Other toughening agents which may be added to the photocurable composition in addition to or in lieu of the reactive particles include one or more hydroxyl-containing compounds. The hydroxyl-containing compound(s) have a functionality of at least 1 and more preferably at least 2, and are free of any groups which inhibit the curing reaction. The hydroxyl-containing compound may be an aliphatic or aromatic hydroxyl-containing compound. Examples include polyether polyols, hydroxyl and hydroxyl/epoxy functionalized polybutadiene, 1,4-cyclohexanedimethanol, polycaprolactone diols and triols, ethylene/butylene polyols, and monohydroxyl functional monomers.

In one embodiment, the hydroxyl-containing compound is a polytetramethylene ether glycol ("poly THF"). The poly THF preferably has a molecular weight from about 250 to about 2500 and may be terminated with hydroxy, epoxy, or ethylenically unsaturated group(s). Commercially available poly THF's include Polymeg® poly THF's, for example, Polymeg® 1000, which is a linear diol with a nominal molecular weight of 1000. (Penn Specialty Chemicals). In another embodiment, the hydroxyl-functional compound is a caprolactone based oligo- or polyester, for example, a trimethylolpropane-triester with caprolactone, such as Tone® 301 (Dow Chemical Co.).

When present, the total amount of the hydroxyl-containing compound which may be added to the photocurable composition may generally be from about 0.01-40% by weight and preferably from about 0.5-20% by weight based on the total weight of the photocurable composition.

The photocurable composition of the present invention may also include other optional components, for example, dyes, stabilizers, modifiers, antifoaming agents, leveling agents, thickening agents, flame retardants, antioxidants, pigments, fillers, and combinations thereof.

Dyes which may be included in the photocurable composition are soluble dye compounds, for example, diarylmethane and triarylmethane dyes, rhodamine dyes, azo dyes, thiazole dyes, anthraquinone dyes and safranine dyes. The dyes may be added directly to the photocurable composition or mixed with other components of the photocurable composition in an amount such that the photocurable composition contains from about 0.0001-0.1% by weight, preferably from about 0.005-0.05% by weight of the dye based on the total weight of the photo curable composition.

Stabilizers which may be added to the photocurable composition to prevent viscosity build-up during usage include butylated hydroxytoluene ("BHT"), 2,6-di-tert-butyl-4-hydroxytoluene, hindered amines, e.g., benzyl dimethyl amine ("BDMA"), N,N-Dimethylbenzylamine, and boron complexes. If used, the stabilizers may constitute from about 0.001% to about 5% by weight based on the total weight of the photocurable composition.

The photocurable compositions of the present invention can be prepared in a known manner, for example, by premixing individual components and then mixing these premixes, or by mixing all of the components together using customary devices, such as stirred vessels. In one embodiment, the mixing is carried out in the absence of light and, if desired, at slightly elevated temperatures ranging from about 30° C. to about 60° C. Furthermore, it is desirable for the photocurable composition to possess a viscosity at 25° C. in the range of 50-1000 cps, preferably 70-700 cps.

In one embodiment, the photocurable composition of the present invention is prepared by mixing from about 35-80% by weight of the cationically curable component, from about 5-60% by weight of the free radically active component, from about 0.1-10% by weight of the cationic photoinitiator, from 0.01-10% by weight of the free radical photoinitiator, and from 0-40% by weight of one or more optional components where the % by weight is based on the total weight of the photocurable composition. In another embodiment, the photocurable composition of the present invention is prepared by mixing from about 30-55% by weight of the cationically curable component comprising a hydrogenated aromatic polyglycidyl compound, from about 5-25% by weight of an oxetane compound having one oxetane ring, from about 5-60% by weight of the free radically active component, from about 0.1-10% by weight of the cationic photoinitiator, from 0.01-10% by weight of the free radical photoinitiator, and from 0-40% by weight of one or more optional components where the % by weight is based on the total weight of the photocurable composition. In still another embodiment, the photocurable composition is produced by mixing from about 45-70% by weight of the cationically curable component comprising polyglycidyl epoxy compound and oxetane compound, greater than 25% by weight to about 40% by weight of the free radically active component comprising one or more ethoxylated and/or propoxylated poly(meth)acrylates and the alicyclic poly(meth)acrylate wherein the amount of the ethoxylated and/or propoxylated poly(meth)acrylate is at least 40% by weight based on the total weight of the free radically active component, from about 0.5-8% by weight of the antimony-free cationic photoinitiator, from about 0.5-4% by weight of the free radical photoinitiator, and from 0-40%, by weight of one or more optional components where the % by weight is based on the total weight of the photocurable composition.

The novel photocurable compositions can be polymerized by irradiation with actinic light, for example by means of electron beams, X-rays, UV or VIS light, preferably with radiation in the wavelength range of 280-650 nm. Particularly suitable are laser beams of HeCd, argon or nitrogen and also metal vapour and NdYAG lasers. This invention is extended throughout the various types of lasers existing or under development that are to be used for the stereolithography process, e.g. solid state, argon ion lasers, etc. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic species and which enable the greatest depth of penetration of the radiation into the compositions which are to be polymerized.

It is preferred that the photocurable compositions of the present invention, upon polymerization by irradiation, produce clear, colorless articles, films or coatings.

It is also preferable that the photocurable compositions, after 1.5 hours of postcure in a postcure apparatus, produce a photohardened object having at least one of the following properties:

(i) Tensile modulus (MPa) at least 2000
(ii) Elongation to break (%) at least 7
(iii) Tensile strength (MPa) at least 35
(iv) Flexural modulus (MPa) at least 1000, preferably 1600-2600
(v) Flexural strength (MPa) at least 50
(vi) Notched izod impact (ft lbs/in) at least 0.5, preferably 0.66-0.86

A further aspect of the present invention includes a process for producing a three-dimenensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article which can be used in various applications, for example, the medical industry, cosmetic industry, automotive industry, aerospace industry, and consumer industry. For example, the three-dimensional article may be used as a medical article, container, headlight, shade or decorative object.

In principle, any stereolithography machine may be used to carry out the inventive method. Stereolithography equipment is commercially available from various manufacturers. Table I lists examples of commercial stereolithography equipment available from 3D Systems Corp. (Valencia, Calif.).

TABLE I

| MACHINE | WAVELENGTH (nm) |
| --- | --- |
| SLA ® 250 | 325 |
| SLA ® 500 | 351 |
| SLA ® 3500 | 355 |
| SLA ® 5000 | 355 |
| SLA ® 7000 | 355 |
| Viper si2 ™ | 355 |

Most preferably, the stereolithography process for producing a three-dimensional article from the photocurable composition of the present invention includes preparing the surface of the composition to form the first layer and then recoating the first layer and each successive layer of the three-dimensional article with a Zephyr™ recoater (3D Systems Corp., Valencia, Calif.), or an equivalent thereof.

It has been surprisingly found that when the photocurable compositions of the present invention are characterized by having a high carbon and hydrogen content relative to oxygen, final cured objects produced from such a composition exhibit excellent properties and transparency. Thus, a further aspect of the present invention relates to photocurable compositions containing a cationically curable component, a free radically active component, a cationic photoinitiator, preferably an antimony-free cationic photoinitiator, a free radical photoinitiator, and optionally one or more other optional components wherein the amounts of the cationically curable component and free radically active component within the photocurable composition are such that the atomic amounts of carbon to hydrogen to oxygen ("C:H:O ratio") for the cationically curable component plus free radically active component is at least 3.0:3.75:1, preferably at least about 3.5:5:1. It has been surprisingly found that when the cationically curable and free radically active components contained within the photocurable composition generate or produce such a C:H:O ratio having a higher hydrophobic character than those described in prior publications, the photo curable composition, under rapid laser curing, produces a clear, colorless three-dimensional article having an excellent balance of strength, toughness, flexibility, dimensional accuracy, durability, stability and improved water resistance.

Although the photocurable composition of the present invention is preferably used in a stereolithography process, it may also be used in three-dimensional jet printing or other rapid prototyping techniques to produce a three dimensional article.

In jet printing, successive droplets of the photocurable composition are applied (e.g. using an ink jet print head such as a piezoelectric jet printing head) at targeted locations on a substrate and irradiated by exposing the droplets to electromagnetic radiation to cure the composition and build up a three dimensional article of a desired shape. The droplets are deposited in accordance with the desired shape which is stored in a computer file, for example a CAD file. The substrate may include paper, textiles, tiles, printing plates, wallpaper, plastic, or paste. The photocurable composition may be irradiated pixel by pixel, line by line, layer by layer, and/or after several layers have been formed, and/or after all layers have been formed. The electromagnetic radiation employed may be UV light, microwave radiation, visible light, laser beams, or other similar sources. The jettable compositions derived from the photocurable compositions described herein may also contain dispersed organic, inorganic, ceramic or metallic nanoparticles Examples include nanosilicates, nanoclays, nanomiea, nano-structured organic polymers, nanoaluminate whiskers, nano-gold or silver colloids.

Alternatively, it is possible to deposit the photocurable composition of the present invention onto a powder. The powder may be spread as a thin layer onto the substrate and the photocurable composition jet deposited onto the powder at desired locations in a desired pattern. The pattern may then be cured by exposing the photocurable composition to UV light. A further layer of powder may then be placed on top of the first layer and the process repeated to build up the three dimensional article. Any uncured powder may be removed after the three dimensional article has been built. A final heat and/or radiation cure may be provided for the three dimensional article after the non-cured powder is removed. The photocurable composition is therefore fully integrated with the powder. The powder may reactive or non-reactive with the jetted photocurable composition. Preferably, the jetted photocurable composition dissolves partially or wholly the powder to produce a viscous immobile composite deposit which can then be cured by electromagnetic radiation, for example, UV radiation.

In another embodiment, the powder contains a reactive component that can react either with the photocurable composition or is facilitated by the photocurable composition to react with itself. The powder may contain organometallic polymers, oligomers, or monomers. Examples include polyacrylic acid, poly(acrylonitrile-co-butadiene, poly(allylamine), polyacrylic resins with functional acrylate groups, polybutadiene, epoxy functionalized butadienes, poly(glycidyl(meth)acrylate), poly THF, polycaprolactone diols, HEMA, HEA, maleic anhydride polymers such as styrene-maleic anhydride, polyvinylbutryals, polyvinyl alcohol, poly(4-vinylphenol), copolymers/blends of these compounds, and any of these compounds endcapped with epoxy, vinyl ether, acrylate/methacrylate, hydroxy, amine or vinyl moieties. The powder may further contain organic or inorganic fillers, a pigment, nanoparticles, a dye, and/or a surfactant.

EXAMPLES

The general procedure used for preparing three-dimensional articles with stereolithography equipment is as follows. The photocurable composition is placed in a vat designed for use with the stereolithography equipment at about 30° C. The surface of the composition, either in its entirety or in accordance with a predetermined pattern, is irradiated with a UV/VIS light source so that a layer of a desired thickness is cured and solidified in the irradiated area. A new layer of the photocurable composition is formed on the solidified layer. The new layer is likewise irradiated over the entire surface or in a predetermined pattern. The newly solidified layer adheres to the underlying solidified layer. The layer formation step and the irradiation step are repeated until a green model of multiple solidified layers is produced.

A "green model" is a three-dimensional article initially formed by the stereolithography process of layering and photocuring, where typically the layers are not completely cured. This permits successive layers to better adhere by bonding together when further cured. "Green strength" is a general term for mechanical performance properties of a green model, including modulus, strain, strength, hardness, and layer-to-layer adhesion. For example, green strength may be reported by measuring flexural modulus (ASTM D 790), tensile properties (ASTM D 638) or notched izod impact (ASTM D 256). An article having low green strength may deform under its own weight, or may sag or collapse during curing.

The green model is then washed in tripropylene glycol monomethyl ether ("TPM") and subsequently rinsed with water and dried with compressed air. The dried green model is next postcured with UV radiation in a postcure apparatus ("PCA") for about 60-90 minutes. "Postcuring" is the process of reacting the green model to further cure the partially cured layers. A green model may be postcured by exposure to heat, actinic radiation, or both.

Tables II-IV list the components of each photocurable composition labeled as Examples 1-16. The numbers in Tables II-IV refer to the weight percent of each component based on the total weight of the photocurable composition. Table V provides further identifying information for the trade names in Tables II-IV.

Calculations of C:H:O ratios are also provided based on the epoxy, acrylate and oxetane content for the cationically curable component and free radically active component in the photocurable compositions. The C:H:O ratios are therefore not based on the photoinitiators or other components contained in the compositions. In performing these calculations, the carbon, hydrogen, and oxygen amounts for each epoxy, acrylate and oxetane are determined and multiplied by their corresponding weight percentages and summed. The C:H:O ratio was then determined by dividing the carbon sum amount and the hydrogen sum amount by the oxygen sum amount. For example, for the photocurable composition of Example 3 described in Table II:

| Component | C | H | O | Total % by weight | C amount | H amount | O amount |
|---|---|---|---|---|---|---|---|
| Epalloy 5000 | 21 | 36 | 4 | 50 | 10.5 | 18 | 2 |
| OXT-101 | 6 | 12 | 2 | 15 | 0.9 | 1.8 | 0.3 |
| SR 499 | 26 | 44 | 12 | 8 | 2.1 | 3.5 | 0.96 |
| SR 833S | 18 | 26 | 4 | 20 | 3.6 | 5.2 | 0.8 |
| Sum | | | | | 17.1 | 28.5 | 4.1 |
| C:H:O | | | | | 4.17 | 6.95 | 1 |

TABLE II

| Component | Ex 1 Comparative | Ex 2 Comparative | Ex 3 | Ex 4 | Ex 5 | Ex 6 |
|---|---|---|---|---|---|---|
| Epalloy 5000 | | | 50 | | 40 | 40 |
| Uvacure 1500 | 53.46 | 57.92 | | | | |
| DER 332 | | 5 | | 58 | 10 | 10 |
| OXT-101 | | | 15 | 15 | 15 | 15 |
| SR 399LV | 15.3 | | | | | |
| SR 499 | | 15 | 8 | 15 | 10 | 10 |
| SR 833S | 20 | | 20 | 5 | 18 | 18 |
| SR 9003 | | | | | | |
| SR 238 | | | | | | |
| NK Ester A-DPH | | 5 | | | | |
| Terathane 250 | 16.2 | | | | | |
| Propoxylated neopentylglycol diacrylate (1 PO/acrylate) | 10 | | | | | |
| Arcol Polyol LG 650 | | 10 | | | | |
| Irgacure 184 | 2.07 | 2 | 2 | 2 | 2 | 2 |
| CPI 6976 | 2.79 | 5 | | | | |

TABLE II-continued

| Component | Ex 1 Comparative | Ex 2 Comparative | Ex 3 | Ex 4 | Ex 5 | Ex 6 |
|---|---|---|---|---|---|---|
| CPI 6992 | 5 | | 5 | 5 | 5 | 5 |
| 87896 | | | | | | 0.033 |
| Stabilizer | 0.18 | 0.08 | | | | |
| Total % by Weight | 100 | 100 | 100 | | 100 | 100 |
| C:H:O Ratios | | | | | | |
| C | 2.69 | 2.7 | 4.17 | 3.89 | 4.08 | 4.08 |
| H | 4.27 | 4.07 | 6.95 | 5.13 | 6.56 | 6.56 |
| O | 1 | 1 | 1 | 1 | 1 | 1 |

TABLE III

| Component | Ex 7 | Ex 8 | Ex 9 | Ex 10 | Ex 11 |
|---|---|---|---|---|---|
| Epalloy 5000 | 46 | 50 | 50 | 50 | 30 |
| DER 332 | 10 | | | 5 | 20 |
| OXT-101 | 10 | 15 | 15 | 10 | 15 |
| CN 2301 | | | | | |
| SR 399LV | 13 | | | | |
| SR 499 | 15 | 28 | 20 | 28 | 20 |
| SR 833S | | | 8 | | 8 |
| SR 9003 | | | | | |
| SR 238 | | | | | |
| Irgacure 184 | 2 | 2 | 2 | 2 | 2 |
| CPI 6992 | 4 | 5 | 5 | 5 | 5 |
| 87896 | 0.033 | | | | |
| Stabilizer | 0.005 | | | | |
| Total % by Weight | 100 | 100 | 100 | 100 | 100 |
| C:H:O Ratios | | | | | |
| C | 3.36 | 3.28 | 3.6 | 3.23 | 3.6 |
| H | 5.32 | 5.63 | 6.14 | 3.8 | 5.66 |
| O | 1 | 1 | 1 | 1 | 1 |

TABLE IV

| Component | Ex 12 | Ex 13 | Ex 14 | Ex 15 | Ex 16 | Ex 17 |
|---|---|---|---|---|---|---|
| Epalloy 5000 | 46 | 46 | 46 | 46 | 51 | 51 |
| DER 332 | 10 | 10 | 10 | 5 | 5 | 5 |
| OXT-101 | 10 | 10 | 10 | 15 | 10 | 15 |
| CN 2301 | | | | | | |
| SR 399LV | | | | | | |
| SR 499 | 15 | | 10 | 10 | 10 | 8 |
| SR 833S | 13 | 13 | 13 | 10 | 10 | 8 |
| SR 9003 | | 15 | | 8 | 8 | 7 |
| SR 238 | | | 5 | | | |
| Irgacure 184 | 2 | 2 | 2 | 2 | 2 | 2 |
| CPI 6992 | 4 | 4 | 4 | 4 | 4 | 4 |
| 87896 | 0.033 | 0.033 | 0.033 | 0.035 | 0.035 | 0.035 |
| Stabilizer | 0.005 | 0.005 | 0.005 | 0.005 | 0.005 | 0.005 |
| Total % by Weight | 100 | 100 | 100 | 100 | 100 | 100 |
| C:H:O Ratios | | | | | | |
| C | 3.88 | 4.42 | 4.07 | 3.95 | 4.02 | 4.09 |
| H | 6.27 | 3.79 | 3.82 | 6.54 | 6.67 | 6.83 |
| O | 1 | 1 | 1 | 1 | 1 | 1 |

TABLE V

| Component | Source | Chemical Name |
|---|---|---|
| Epalloy 5000 | CVC Specialty Chemicals Inc. | Epoxidized Hydrogenated Bisphenol A |
| Uvacure 1500 | Cytec | 3,4 epoxycyclohexylmethyl-3',4'-epoxycyclohexyl carboxylate |
| DER 332 | Dow Chemical Co. | Bisphenol A diglycidyl ether |
| OXT-101 | Toagosei Co. Ltd. | 3-ethyl-3-hydroxymethyl-1-oxetane |
| CN 2301 | Sartomer Co. Inc. | Hyperbranched polyester acrylate oligomer |
| SR 399LV | Sartomer Co. Inc. | Dipentaerythritol monohydroxy pentaacrylate |
| SR 499 | Sartomer Co. Inc. | Ethoxylated (6) trimethylolpropane triacrylate |
| SR 833S | Sartomer Co. Inc. | Tricyclodecane dimethanol diacrylate |
| SR 9003 | Sartomer Co. Inc. | Propoxylated (2) neopentyl glycol diacrylate |
| SR 238 | Sartomer Co. Inc. | 1,6-hexanediol diacrylate |
| NK Ester A-DPH | Kowa Co. Ltd. | Dipentaerythritol hexaacrylate |
| Terathane 250 | Invista | α-hydro-ω-hydroxy-poly(oxy-1,4-butanediyl) |
| Arcol LG 650 | Bayer Material Science | Propylene glycol triol |
| Irgacure 184 | Ciba Specialty Chemicals | 1-hydroxycyclohexyl phenyl ketone |
| CPI 6992 | Aceto Co. | Mixed arylsulfonium hexafluorophosphate salts |
| CPI 6976 | Aceto Co. | Mixed arylsulfonium hexafluoroantimonate salts |
| 87896 | | Liquid epoxy + dye |

Examples 1-17 were prepared by combining the components and mixing at room temperature until the mixture was a homogeneous photocurable composition. Three dimensional articles were then prepared from the photocurable compositions on either an SLA350 or SLA7000 stereolithography machine. After fabrication, the partially cured articles were cleaned, dried, and then post cured for 1.5 hours to allow the resin to fully cure. The test articles were then conditioned for 3-5 days at 23° C., 50% relative humidity.

Mechanical properties of the articles were measured according to the following ASTM standards: tensile properties (elongation to break, strength, modulus) D 638; flexural properties (maximum strength, modulus) D 790; and notched izod impact (impact strength) D 256.

Yellow index (YI) measurements were done in accordance with ASTM D1925 using a Byk Gardener Color Sphere Spectrophotometer and a 25 min. aperture. Calibration and a blank (air) were run before measurements were taken and recorded from the spectrophotometer. YI/inch thickness was calculated be dividing YI by the thickness of the cured article (expressed in inches).

Clarity was evaluated by visually inspecting a 4 mm thick cured article and qualifying the cured article as either hazy (H) or clear (T).

The results are shown below in Tables VI-VIII:

TABLE VI

| | 1 Comparative | 2 Comparative | 3 | 4 | 5 | 6 |
|---|---|---|---|---|---|---|
| Clarity | NA | NA | T | T | T | T |
| YI/inch thickness | NA | NA | 125 | not measured (yellow) | 109 | 104 |
| Flexural Modulus (MPa) | NA | NA | 2200 | 2600 | 2700 | 2700 |

TABLE VII

| | 7 | 8 | 9 | 10 | 11 |
|---|---|---|---|---|---|
| Clarity | T | T | T | T | T |
| YI/inch thickness | 77 | 42 | 50 | 42 | 60 |
| Flexural Modulus (MPa) | not measured (weak) | 380 | 1600 | 1400 | 2600 |

TABLE VIII

| | 12 | 13 | 14 | 15 | 16 |
|---|---|---|---|---|---|
| Clarity | T | T | T | T | T |
| YI/inch thickness | 47 | 65 | 63 | 56 | 50 |
| Flexural Modulus (MPa) | 2200 | 2300 | 2100 | 2400 | 2400 |
| Tensile Modulus (MPa) | | | | | 2000 |
| Elongation to break (%) | | | | | 15 |
| Tensile strength (MPa) | | | | | 42 |
| Flexural strength (MPa) | | | | | 68 |
| Notched izod impact (ft lbs/in) | | | | | 0.66-0.86 |

Color measurements were also taken for Examples 2, 16 and glass. The color scale used for these measurements was the CIELAB system (L*a*b). The scale for the CIELAB system can be visualized as a cylindrical coordinate system in which the axis of the cylinder is the lightness variable L* ranging from 0-100%, and the radii are the chromacity variables a* and b*. Variable a* is the green (negative) to red (positive) axis and variable b* is the blue (negative) to yellow (positive) axis.

Figure 2:
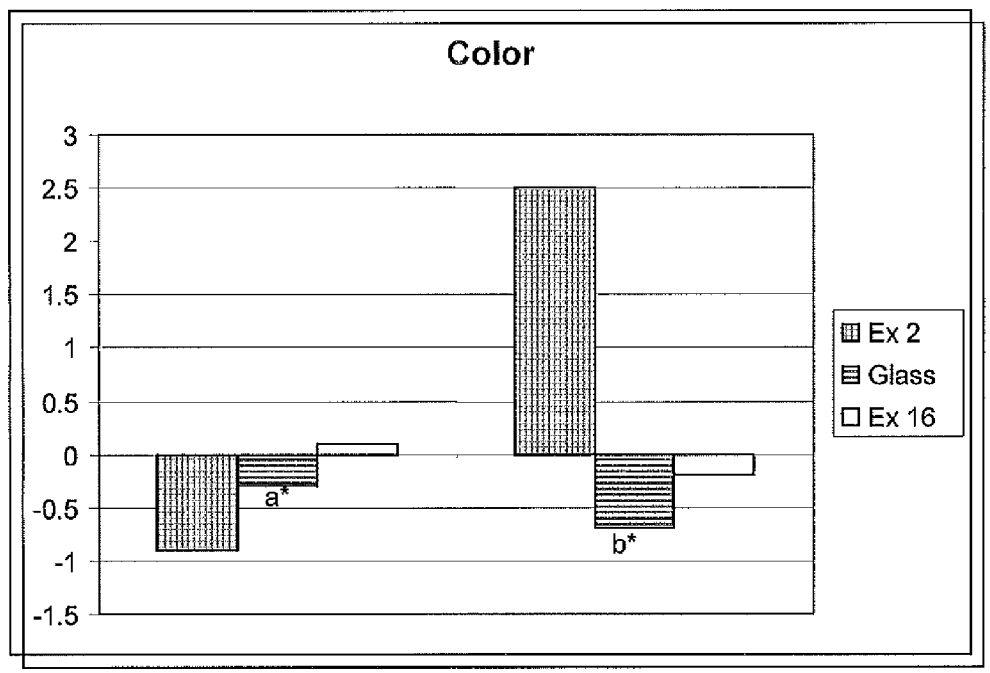

The apparatus used for these color measurements was a Minolta CM-2500d spectrophotometer machine. The diameter of the aperture was 10 mm. The solid samples of Examples 2 and 16 were built to have the dimensions of 12 mm×12 mm×5 mm. A 4 mm thick glass plate was used as the glass sample. After zero and white calibration, measurements were taken with an illumination that contained all UV components of Xe flash light source. The results are given in Table IX and described in FIGS. 1-2 and show Example 16, produced from a photocurable composition according to the present invention, is as clear as glass and also of the same level of color,

TABLE IX

| Example | L* | a* | b* |
|---|---|---|---|
| 2 Comparative | 37.8 | −0.9 | 2.5 |
| 16 | 34.4 | −0.3 | −0.7 |
| Glass | 33.6 | 0.1 | −0.2 |

Although making and using various embodiments of the present invention have been described in detail above, it should be appreciated that the present invention provides many applicable inventive concepts that can be embodied in a wide variety of specific contexts. The specific embodiments discussed herein are merely illustrative of specific ways to make and use the invention, and do not delimit the scope of the invention.

What is claimed is:

1. A photocurable composition comprising:
   (a) 35-80% by weight of a cationically curable component comprising a polyglycidyl epoxy compound;
   (b) 15-60% by weight of a free radically active component comprising an ethoxylated and/or propoxylated poly(meth)acrylate;
   (c) 0.1-10% by weight of an antimony-free cationic photoinitiator;
   (d) 0.01-10% by weight of a free radical photoinitiator; and
   (e) 0-40% by weight of one or more optional components wherein the percent by weight is based on the total weight of the photocurable composition, wherein the photocurable composition has no antimony content, wherein the cationically curable component and free radically active component produce a C:H:O ratio of at least 3.0:3.75:1, and wherein the photocurable composition, after cure, is clear and has a yellowness index/inch thickness of less than 70 and a flexural modulus of at least 1000 MPa.

2. The photocurable composition of claim 1 wherein the C:H:O ratio is at least 3.5:5.0:1.

3. The photocurable composition of claim 1 wherein the free radically active component further comprises a non-aromatic poly(meth)acrylate.

4. The photocurable composition of claim 3 wherein the poly(meth)acrylate is an alicyclic poly(meth)acrylate.

5. The photocurable composition of claim 1 wherein the antimony-free cationic photoinitiator is of the formula (I):

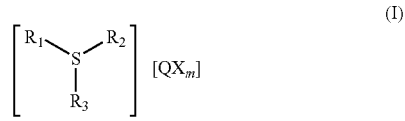

where
R$_1$, R$_2$ and R$_3$ are each independently of one another C$_{6-18}$ aryl that is unsubstituted or substituted by radicals selected from the group consisting of C$_{1-6}$ alkyl; C$_{1-6}$ alkoxy; C$_{1-6}$ alkylthio; halogen; amino groups; cyano groups;
nitro groups, and arylthio;
Q is boron or phosphorus;
X is a halogen atom; and
m is an integer corresponding to the valence of Q plus 1.

6. The photocurable composition of claim 1 wherein the polyglycidyl epoxy compound comprises a hydrogenated bisphenol epoxy-containing compound.

7. The photocurable composition of claim 6 wherein the cationically curable component further comprises an oxetane compound.

8. The photocurable composition of claim 1 wherein the cationic photoinitiator is a triarylsulfonium hexafluorophosphate salt.

9. A photocurable composition comprising:
   (a) 35-80% by weight of a cationically curable component comprising one or more epoxy-containing compounds and one or more oxetane compounds;
   (b) 15-60% by weight of a free radically active component comprising
      (i) at least one ethoxylated or propoxylated poly(meth)acrylate or mixture thereof and
      (ii) a non-aromatic poly(meth)acrylate;
   (c) 0.1-10% by weight of an antimony-free cationic photoinitiator;
   (d) 0.1-10% by weight of a free radical photoinitiator;
   (e) 0-40% by weight of one or more optional components wherein the photocurable composition has no antimony content, wherein the cationically curable component and free radically active component produce a C:H:O ratio of at least 3.0:3.75:1, and wherein the photocurable composition, after cure by exposure to actinic radiation and optionally heat, has a yellowness index/inch thickness of less than 70.

10. The photocurable composition of claim 9 wherein the C:H:O ratio is at least 3.5:5.0:1.

11. The photocurable composition of claim 9 wherein the cationically curable component comprises a hydrogenated bisphenol epoxy-containing compound.

12. A process for producing a colorless three dimensional article comprising:
   (a) forming a first layer of the photocurable composition of claim 1 on a surface;
   (b) exposing the layer imagewise to actinic radiation to form an imaged cross-section, wherein the radiation is of sufficient intensity to cause substantial curing of the layer in the exposed areas;
   (c) forming a second layer of the composition of claim 1 on the previously exposed imaged cross-section;
   (d) exposing the second layer from step (c) imagewise to actinic radiation to form an additional imaged cross-section, wherein the radiation is of sufficient intensity to cause substantial curing of the second layer in the exposed areas and to cause adhesion to the previously exposed imaged cross-section; and
   (e) repeating steps (c) and (d) a sufficient number of times in order to build up the three-dimensional article.

13. A three-dimensional medical article produced according to the process of claim 12.

14. A three-dimensional article produced according to the process of claim 12 wherein the article is a container, headlight, shade or decorative object.

15. A process for producing a three dimensional article by jet printing comprising the steps of:
   (a) applying successive droplets of the photocurable composition of claim 1 at targeted locations on a substrate in accordance with a desired shape stored on a computer file;
   (b) exposing the droplets to electromagnetic radiation to cure the droplets in the exposed areas;
   (c) repeating steps (a) and (b) a sufficient number of times in order to build up the three dimensional article.

16. The process of claim 15 wherein the substrate comprises paper, textiles, tiles, printing plates, wallpaper, plastic, powder or paste.

17. The process of claim 16 wherein the photocurable composition is exposed to electromagnetic radiation pixel by pixel, line by line, layer by layer, after several layers have been formed, and/or after all layers have been formed.

18. The process of claim 17 wherein the electromagnetic radiation employed is UV light, microwave radiation, visible light, or laser beams.

19. A photocurable composition comprising:
   (a) 35-80% by weight of a cationically curable component comprising a hydrogenated aromatic polyglycidyl epoxy compound;
   (b) 15-60% by weight of a free radically active component comprising an ethoxylated and/or propoxylated poly(meth)acrylate;

(c) 0.1-10% by weight of an antimony-free cationic photoinitiator;
(d) 0.01-10% by weight of a free radical photoinitiator; and
(e) 0-40% by weight of one or more optional components
(f) 5-25% of an oxetane compound having one oxetane ring wherein the percent by weight is based on the total weight of the photocurable composition, wherein the photocurable composition has no antimony content, and wherein the photocurable composition has a C:H:O ratio of at least 3.0:3.75:1 and after cure, is clear and has a yellowness index/inch thickness of less than 70 and a flexural modulus of at least 1000 MPa.

20. The photocurable composition of claim 19 wherein the C:H:O ratio is at least 3.5:5.0:1.

21. The photocurable composition of claim 9 wherein the amount of the ethoxylated or propoxylated poly(meth)acrylate or mixture thereof is greater than 40% by weight of the total amount of free radically active component.

* * * * *